United States Patent [19]

Shimada

[11] Patent Number: 5,953,085
[45] Date of Patent: Sep. 14, 1999

[54] LIQUID CRYSTAL DISPLAY DEVICE HAVING A STORAGE CAPACITOR

[75] Inventor: Shinji Shimada, Kashihara, Japan

[73] Assignee: Sharp Kabushiki Kaisha, Osaka, Japan

[21] Appl. No.: 08/964,853

[22] Filed: Nov. 5, 1997

[30] Foreign Application Priority Data

Nov. 22, 1996 [JP] Japan .................................... 8-311600

[51] Int. Cl.⁶ ............................................... G02F 1/1343
[52] U.S. Cl. ............................................................ 349/39
[58] Field of Search ..................... 349/38, 39; 257/59, 257/72

[56] References Cited

U.S. PATENT DOCUMENTS

| | | | |
|---|---|---|---|
| 5,126,867 | 6/1992 | Ishiwata | ................................ 349/172 |
| 5,159,477 | 10/1992 | Shimada et al. . | |
| 5,414,278 | 5/1995 | Kobayashi et al. | ...................... 349/39 |
| 5,461,501 | 10/1995 | Sato et al. . | |
| 5,499,123 | 3/1996 | Mikoshiba . | |
| 5,585,951 | 12/1996 | Noda et al. . | |
| 5,641,974 | 6/1997 | den Boer et al. . | |
| 5,721,601 | 2/1998 | Yamaji et al. . | |
| 5,745,195 | 4/1998 | Zhang | ...................................... 349/39 |
| 5,777,701 | 7/1998 | Zhang | ...................................... 349/38 |

FOREIGN PATENT DOCUMENTS

| | | |
|---|---|---|
| 62-178296 | 4/1987 | Japan . |
| 1-33833 | 3/1989 | Japan . |
| 5-216067 | 8/1993 | Japan . |
| 5-289111 | 11/1993 | Japan . |
| 07146491 | 6/1995 | Japan . |

*Primary Examiner*—William L. Sikes
*Assistant Examiner*—James A. Dudek
*Attorney, Agent, or Firm*—Nixon & Vanderhye P.C.

[57] ABSTRACT

A liquid crystal display device is provided which comprises a pair of substrates; a plurality of non-linear elements and associated bus lines for supplying electrical signals to the plurality of non-linear elements, the non-linear elements and the bus lines being formed on at least one of the substrates; a liquid crystal interposed between the pair of substrates; a first insulating film formed on the plurality of non-linear elements and the bus lines; and a storage capacitor electrode, a second insulating film and a pixel electrode formed on the first insulating film, the second insulating film has a higher dielectric constant than that of the first insulating film.

17 Claims, 4 Drawing Sheets

PRIOR ART

LIQUID CRYSTAL DISPLAY DEVICE HAVING A STORAGE CAPACITOR

BACKGROUND OF THE INVENTION

1. Field of the Invention

The present invention relates to a liquid crystal display device, and in particular to an active matrix-type liquid crystal display device having a storage capacitor.

2. Description of the Related Art

An active matrix-type liquid crystal display device having a switching element for each of pixel electrodes, which provides a highly precise and high density display, has been put into practical use, and further actively researched and developed for creating a highly precise, high density and large screen display.

As shown in FIG. 2, an active matrix display device comprises a gate driver 47 and a source driver 48, a plurality of gate bus lines 41 (G1–Gn) and source bus lines 42 (S1–Sm) each of which crosses at right angle, a thin film transistor (TFT) substrate having a thin film transistor 43 and a pixel electrode 44 which are disposed in a cross portion of each of these bus lines, a liquid crystal interposed between the TFT substrate and its opposite substrate, and a liquid cell 46 formed between the pixel electrode 44 and a common electrode 45 of the opposite substrate. The gate electrode and the source electrode of the thin film transistor 43 are connected to each of the gate bus lines 41 and the source bus lines 42, respectively, and the pixel electrode 44 is connected to a drain electrode. While a scanning signal is successively applied from the gate driver 47 on each of the gate bus lines 41, an image signal from the source driver 48 is supplied and written into the individual liquid crystal cell 46 through the thin film transistor 43. Then, the potential of the pixel electrode 44 is held in a capacitor of the liquid crystal cell 46 until the image signal is rewritten in the next frame period.

However, the holding potential creates a level shift toward the negative electrode side due to the charge redistribution in a capacitor formed between the gate electrode and the drain electrode, since the potential applied to a liquid crystal cell is asymmetric between the negative and positive electrodes, and the direct current component is applied to the liquid crystal which is responsible for a display flicker. Also, the holding potential of the pixel electrode is gradually reduced due to a leak between the source and the drain in the thin film transistor and a self-discharge through the resistance component of the liquid crystal cell during the holding period. These problems become more prominent with the development of a highly precise liquid crystal display device and a finer pixel electrode.

In order to solve the aforementioned problems, an improved liquid crystal display device has been proposed which comprises a storage capacitor placed parallel to the liquid crystal cell to control the level shift due to the charge redistribution and at the same time provides an increased pixel capacity as well as an increased discharge time constant to prevent the reduction of the holding potential. This storage capacitor has either a structure comprising the partially overlapped previous gate bus line and pixel electrode, or a structure comprising a capacitor formed between a separately formed auxiliary electrode line and a pixel electrode. The former provides a wider aperture ratio, but is affected by the variation in the potential applied on the gate bus line. Although the latter provides a stable pixel potential, its lowered aperture ratio provides a reduced display brightness. At present, a liquid crystal display device with the latter structure has often been used due to its stable display screen. The liquid crystal display device having such a structure include those described below.

Japanese Laid-open Patent Publication No. 5-289111 discloses a liquid crystal display device comprising a pixel electrode, a passivation film formed on the pixel electrode, and a storage capacitor electrode formed on the passivation film. However, this liquid crystal display device suffers from the reduction of the potential applied to the liquid crystal layer.

Japanese Laid-open Patent Publication No. 5-216067 discloses a liquid crystal display device comprising two insulating layers formed between a gate electrode and a pixel electrode. The liquid crystal display device comprises a thin film transistor array substrate, an opposite substrate having a common electrode, and a liquid crystal layer interposed between these substrates. As shown in FIGS. 3 and 4, the thin film transistor array substrate comprises a transparent substrate 51; a silicon semiconductor layer 52 formed thereon; a n-type or p-type impurity-doped polysilicon region 61; and a gate insulating film 53, a gate electrode 54, a source electrode 55 and a drain electrode 56 which are successively formed on the silicon semiconductor layer 52; a pixel electrode 57 connected to the drain electrode 56; two insulating layers 58 and 60 disposed between the gate electrode 54 and the pixel electrode 57; and a transparent storage electrode 59 formed on the first insulating layer 58. Thus, a storage capacitor is formed in an overlapping portion of the transparent storage electrode 59 and the pixel electrode 57. In such a structure, since the transparent storage electrode 59 is made from a transparent material, the resulting liquid crystal display device provides an improved aperture ratio.

However, in the case of the structure shown in FIGS. 3 and 4, the transparent storage electrode 59 is formed by high temperature processing at about 1000° C. and the first insulating layer 58 thereunder is also heated to about 1000° C. Therefore, the first insulating layer 58 is easily destroyed. And, when the first insulating layer 58 of the liquid crystal display device has a higher dielectric constant, the parasitic capacity of the bus lines will be increased. On the other hand, when the second insulted layer 60 has a lower dielectric constant, the storage capacity will not be sufficiently increased. For that reason, it is necessary to extend the area of the transparent storage electrode 59 so as to increase the storage capacity. Also, because the transparent storage electrode 59 is placed in the pixel region of the liquid crystal display device, a certain amount of light absorbed into the electrode may cause the reduction of the light transmittance in the device. Moreover, where both the transparent storage electrode 59 and the pixel electrode 57 are made from the same material such as indium tin oxide (ITO) or the like, any defect of the second insulating layer 60 may cause the generation of a short-circuit between the transparent storage electrode 59 and the pixel electrode 57.

SUMMARY OF THE INVENTION

The liquid crystal display device the present invention comprises a pair of substrates; a plurality of non-linear elements and associated bus lines for supplying electrical signals to the plurality of non-linear elements, the plurality of non-linear elements and the bus lines being formed on at least one of the substrates; a liquid crystal interposed between the pair of substrates; a first insulating film formed on the plurality of non-linear elements and the bus lines; and a storage capacitor electrode, a second insulating film and a pixel electrode formed on the first insulating film, wherein the second insulating film has a higher dielectric constant than that of the first insulating film.

Since the liquid crystal display device of the present invention comprises the first insulating film having a lower dielectric constant formed on the bus lines, it is possible to control the parasitic capacity of the bus lines. Also, since the liquid crystal display device of the present invention comprises the second insulating film having a higher dielectric constant interposed between the storage capacitor electrode and the pixel electrode, it can provide an increased storage capacity even when the storage capacitor electrode has a smaller area. Moreover, since this storage capacitor electrode is not formed in the pixel region of the liquid crystal display device, the light transmittance of the pixel electrode is not reduced, thereby providing a further increased aperture ratio of the liquid crystal display device.

In one embodiment, the liquid crystal display device of the present invention comprises the first insulating film having a dielectric constant of about 3.5 or less, preferably, about 1 to about 3.5, more preferably about 1 to about 3.

In this embodiment, it is possible to further reduce the parasitic capacity of the bus lines.

In another embodiment, the liquid crystal display device of the present invention comprises the second insulating film having a dielectric constant of about 3.5 or more, preferably, about 3.5 to about 25, more preferably about 7 to about 25.

In this embodiment, it is possible to further increase the storage capacity of the liquid crystal display device.

In still another embodiment, the liquid crystal display device of the present invention comprises the first insulating film made from an organic insulating material.

In this embodiment, it is possible to form the first insulating film having any thickness of several µm at a process temperature of about 300° C. or less without requiring a long period of time. Also, it is possible to flatten the surface of the first insulating film.

In still another embodiment, the liquid crystal display device of the present invention comprises the second insulating film made from an inorganic insulating material.

In this embodiment, it is possible to form the second insulating film having no pinholes with high quality and good coverage using the chemical vapor deposition (CVD) method. The thickness of the second insulating film can be reduced down to approximately about 100 nm. Also, where the pixel electrode is made from ITO, the second insulating film made from an inorganic insulating material provides a more controlled etching variation than that made from an organic insulating material.

In still another embodiment, the storage capacitor of the liquid crystal display device of the present invention is formed on the non-linear elements and made from an opaque metal material.

In this embodiment, the opaque metal material can be used as a light-shading film for the non-linear elements, thereby eliminating the necessity of forming a light-shading film on the opposite substrate.

In still another embodiment, the liquid crystal display device of the present invention comprises the first insulating film made from a polymer compound having a glass transition temperature of about 200° C. or higher, preferably about 300° C. or higher.

In this embodiment, it is possible to form the second insulating film having no pinholes with high quality and good coverage, and also to prevent a short-circuit between the storage capacitor electrode and the pixel electrode.

In still another embodiment, the liquid crystal display device of the present invention comprises the storage capacitor electrode made from a different material from that of the pixel electrode.

In this embodiment, it is possible to control the generation of a short-circuit between the storage capacitor electrode and the pixel electrode.

Thus, the present invention described herein makes possible the advantages of: (1) providing a liquid crystal display device having a controlled capacity of the bus lines as well as an increased storage capacity; and (2) providing a liquid crystal display device having a greater aperture ratio.

These and other advantages of the present invention will become apparent to those skilled in the art upon reading and understanding the following detailed description with reference to the accompanying figures.

DESCRIPTION OF THE PREFERRED EMBODIMENTS

The following illustrate an example of the present invention with reference to the drawings, but the present invention is not limited to this example.

EXAMPLE

FIGS. 1A–1D are sectional views showing a process for preparing one example of the liquid crystal display device of the present invention.

Figure 1A:
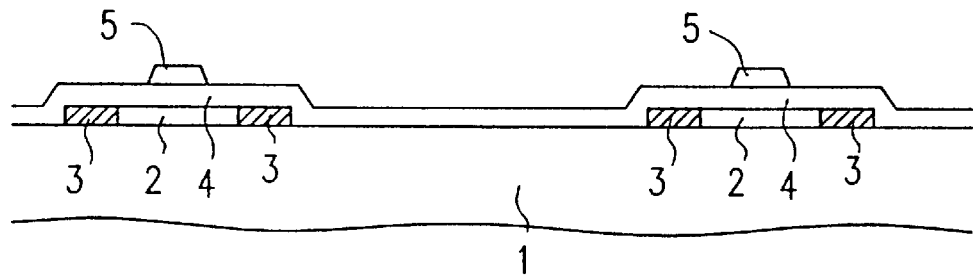
FIGS. 1A–1D are sectional views showing a process for preparing one example of the liquid crystal display device of the present invention.

First, as shown in FIG. 1A, a basecoat film (not shown) which is an insulating film made from silicon nitride, tantalum oxide or the like is optionally formed on the glass substrate 1 for the purpose of preventing the incorporation of any impurities from the upper glass layer of the glass substrate 1. On the glass substrate 1 comprising the basecoat film formed thereon, an amorphous silicon film is deposited using the CVD method. The amorphous silicon film is crystallized by irradiating with a successive scanning of excimer laser to form a polysilicon film. Instead of using the excimer laser, the amorphous silicon film may be subjected to a thermal treatment. Also, it is possible to combine the excimer laser irradiation with such a thermal treatment as baking, etc. Then, the resulting polysilicon film is patterned by photolithography to form an island semiconductor region 2 having a size and a shape necessary for forming a thin film transistor in a portion in which the switching elements of the pixel electrode are later formed. On the island polysilicon semiconductor region 2, a gate insulating film 4 made from a silicon oxide is formed by the CVD method. The gate insulating film 4 may also be made from silicon nitride. On the gate insulating film 4, an aluminum/silicon alloy film is deposited and patterned by the photolithography to form a gate electrode 5 and a gate bus line (not shown). The gate electrode 5 and the gate bus line may be made using a conductive material having less than the prescribed conductivity, for example, aluminum, tantalum, titanium, chromium, molybdenum, copper, doped silicon, ITO, and alloys thereof, and the like. Then, the gate electrode 5 is used as a mask, and a phosphorus ion is doped by an ion doping device in a source region and a drain region of the island semiconductor region 2 to form an n⁺ region 3. That is, the n⁺ region 3 is formed by the so-called self-alignment. Where a p⁺ region is formed instead of the n⁺ region, a boron ion is doped instead of the phosphorus ion. Also, the n⁺ region 3 may be formed by depositing and patterning an n⁺ silicon, instead of using this ion doping method. FIG. 1A shows a thin film transistor substrate thus formed.

Figure 1B:
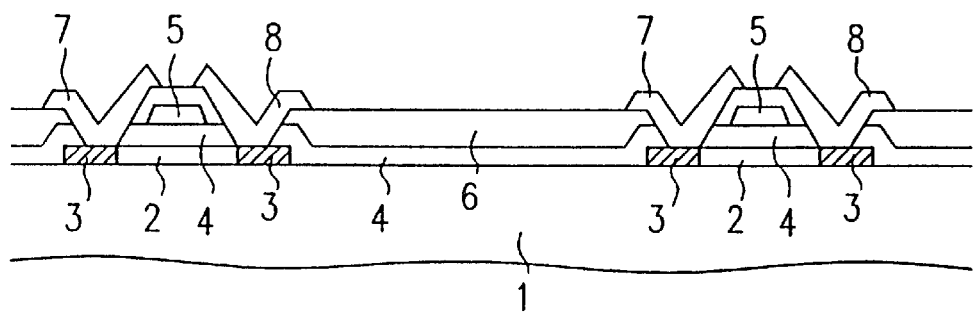

Then, as shown in FIG. 1B, a silicon oxide interlayer insulating film 6 is formed by the CVD method on the gate insulating film 4. In the n⁺ region side 3 of the interlayer insulating film 6, contact holes are formed by formed by photolithography. On these contact holes, an aluminum film is deposited, and patterned by photolithography to form a source electrode 7, a drain electrode 8 and a source bus line (not shown). The source electrode 7, the drain electrode 8 and the source bus line may be made using for example, aluminum, tantalum, titanium, chromium, molybdenum, copper, doped silicon, ITO, and alloys thereof, and the like. FIG. 1B shows a thin film transistor substrate having these elements formed thereon.

Figure 1C:
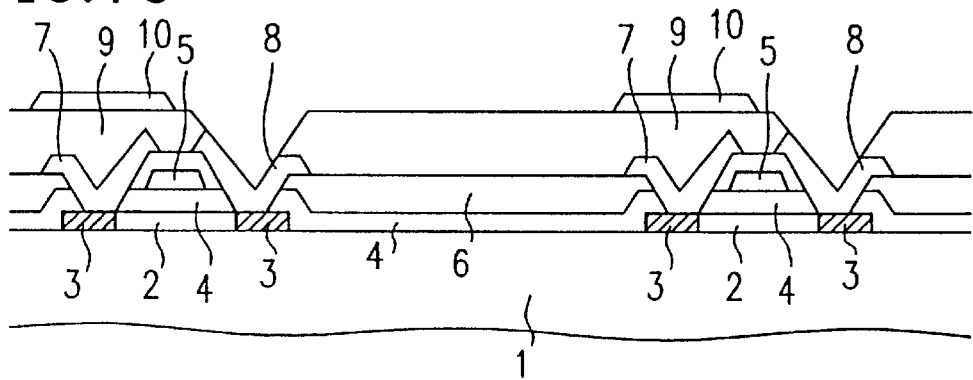

Then, as shown in FIG. 1C, the first insulating film 9 is formed on this thin film transistor substrate by coating it with a polyimide resin. The first insulating film 9 is patterned using photolithography into the prescribed shape to form contact holes connecting the drain electrode 8 to the later formed pixel electrode 12. The first insulating film 9 may desirably be made using an organic insulating material such as acrylics, polyamide-imides, polyamides and various other resins. However, the organic insulating material preferably is a polymer compound having a glass transition temperature of about 200° C. or higher, desirably about 300° C. or higher, in consideration of the following processes. It is desirable that the first insulating film 9 has a dielectric constant of about 3.5 or less, preferably about 1 to about 3.5, more preferably about 1 to about 3, for the purpose of reducing the parasitic capacity of the bus lines, and has a film thickness of about 1 μm to about 1 mm. Then, titanium is deposited on the first insulating film 9 at a temperature ranging from ambient temperature to about 200° C., and patterned by photolithography to form a storage capacitor electrode 10 above the thin film transistor and between the later formed pixel electrodes 12. FIG. 1C shows a thin film transistor substrate having the first insulating film 9 and the storage capacitor electrode 10 formed thereon. The storage capacitor electrode 10 is preferably made from an opaque metal material. When the storage capacitor electrode 10 is made from an opaque metal material and disposed in a gap of the later formed pixel electrode 12, it can function as a light-shading film for the thin film transistor substrate, thereby eliminating the necessity of forming a light-shading film on the opposite substrate. The storage capacitor electrode 10 may be made using, for example, aluminum, tantalum, chromium, molybdenum, copper, doped silicon, and the like, instead of titanium. Moreover, when the storage capacitor electrode 10 is made from a black conductive material such as titanium oxide, it is possible to prevent reflective light from entering into the resulting liquid crystal display device. Also, when an anionically oxidizable metal such as tantalum is used, the surface of the storage capacitor electrode 10 may be anionically oxidized to form an oxide thereon, making it possible to further prevent a short-circuit between the storage capacitor electrode 10 and the pixel electrode 12.

Figure 1D:
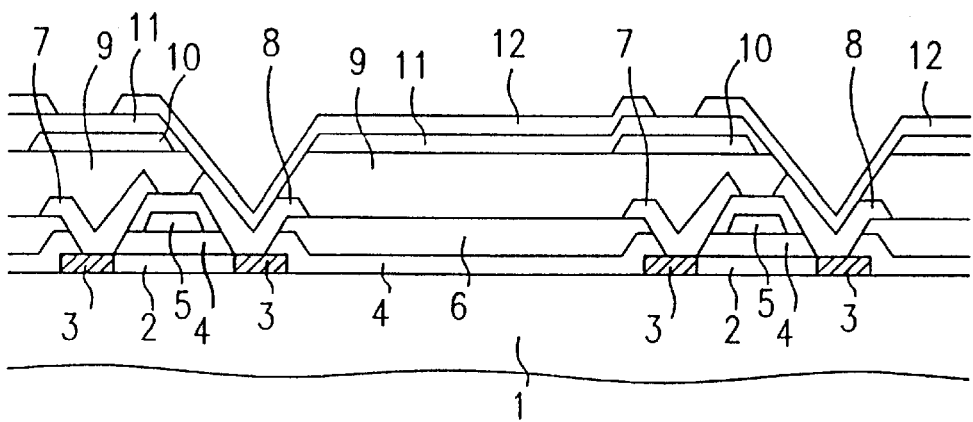
Figure 2:
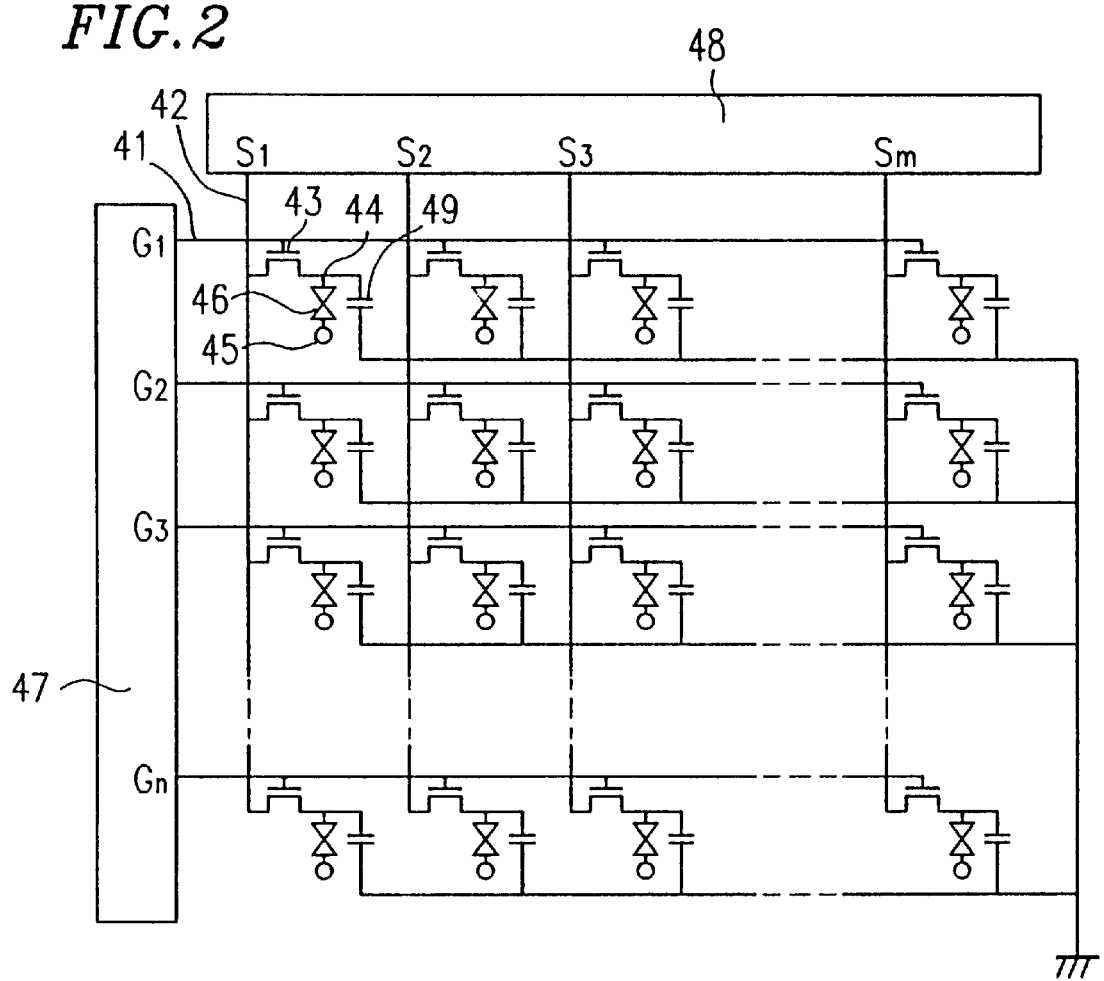
FIG. 2 is a circuit structural view showing a thin film transistor array substrate of the liquid crystal display device.
Figure 3:
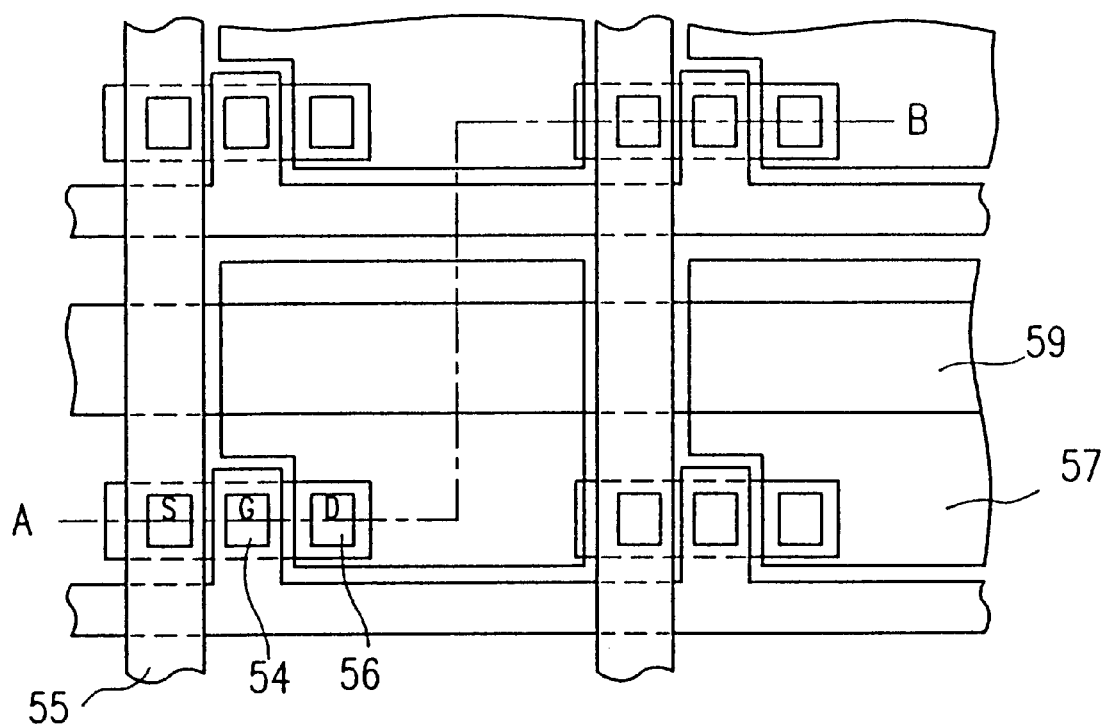
FIG. 3 is a plan view showing the conventional liquid crystal display device.
Figure 4:
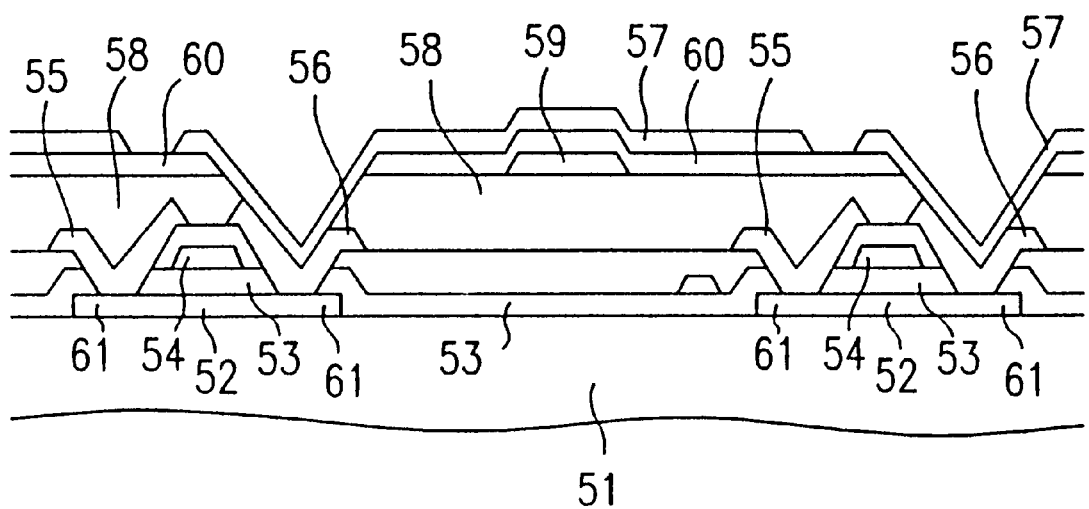
FIG. 4 is a sectional view taken along the line A—B of FIG. 3.

Thereafter, as shown in FIG. 1D, silicon nitride is deposited by the CVD method on the first insulating film 9 and the storage capacitor electrode 10 at such a temperature that will not damage the first insulating film 9 and the storage capacitor electrode 10, for example, about 200 to about 300° C. to form the second insulating film 11. The second insulating film 11 is patterned using the photolithography into the prescribed shape to form contact holes connecting the drain electrode 8 to the later formed pixel electrode 12. The second insulating film 11 may be made using silicon oxide. However, because silicon oxide has a dielectric constant of approximately 4 while silicon nitride has a dielectric constant of approximately 7, in the case of forming the same capacity, the use of silicon nitride provides the second insulating film 11 having a greater film thickness and therefore the generation rate of the short-circuits can be reduced. It is desirable that the second insulating film 11 has a dielectric constant of about 3.5 or more, preferably about 3.5 to about 25, more preferably about 7 to about 25, and has a film thickness of about 100 nm to about several μm. The second insulating film 11 having a thinner film thickness provides a greater storage capacity. The use of the CVD method can provide a high quality thin film having mostly no pinholes with a film thickness of approximately about 100 nm. Then, ITO is deposited on the second insulating film 11, and patterned by photolithography to form a pixel electrode 12. The pixel electrode 12 is formed so that the storage capacitor electrode 10 is disposed in a gap of the pixel electrode 12. In the case of forming a reflective-type liquid crystal display device, the pixel electrode 12 is made from a metal such as aluminum, instead of ITO. The presence of the second insulating film 11 interposed between the storage capacitor electrode 10 and the pixel electrode 12 will increase sufficiently the storage capacity even when using the storage capacitor electrode 10 having a smaller area. Also, since the storage capacitor 10 is formed in a gap of the pixel electrode 12, the resulting liquid crystal display device provides a further greater aperture ratio. FIG. 1D shows this complete thin film transistor substrate.

After forming an alignment film on each of the thin film transistor substrate thus formed and an opposite substrate having an ITO electrode as an opposite electrode, these substrates are subjected to an alignment treatment in the prescribed direction. While ensuring a certain gap by dispensing spacers, the peripheral portions of these substrates are adhered with a seal resin. After a liquid crystal is injected between both substrates, the injection inlet is sealed to complete a liquid crystal cell. At the time of adhering both substrates, the storage capacitor electrode 10 is connected to the opposite electrode. Then, a signal is input from the same terminal into these electrodes to drive them at the same potential. A polarizing plate and a liquid crystal driver are mounted on the liquid crystal cell which is then connected to a driving circuit and other devices to form a liquid crystal display device. The liquid crystal driver and the driving circuit may be made from a polysilicon thin film transistor, and formed on the same substrate as the thin film transistor substrate having the switching element for the pixel electrode.

Although the above-described Example illustrates an active matrix-type liquid crystal display device comprising a thin film transistor formed by a polysilicon on a glass substrate, displays those comprising non-linear elements formed by an amorphous silicon and displays comprising a thin film transistor formed by a quartz substrate can also be made in a similar manner.

Since the liquid crystal display device of the present invention comprises the first insulating film having a lower dielectric constant formed on the bus lines, it is possible to control the parasitic capacity of the bus lines. Also, since the liquid crystal display device of the present invention comprises the second insulating film having a higher dielectric constant interposed between the storage capacitor electrode and the pixel electrode, it can provide an increased storage capacity even when the storage capacitor electrode has a smaller area. Moreover, since this storage capacitor electrode is not formed in the pixel region of the liquid crystal display device, the light transmittance of the pixel electrode is not reduced, thereby providing a further increased aperture ratio for the liquid crystal display device.

According to the present invention, a liquid crystal display device having a controlled capacity of the bus lines and an increased storage capacity as well as a further greater aperture ratio can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A liquid crystal display device, comprising:
    a pair of substrates;
    a plurality of non-linear elements, and associated bus lines for supplying electrical signals to said plurality of non-linear elements, said plurality of non-linear elements and said bus lines being formed on at least one of said substrates;
    a liquid crystal interposed between said pair of substrates;
    a first insulating film formed on said plurality of non-linear elements and said bus lines; and
    a storage capacitor electrode, a second insulating film and a pixel electrode formed on the first insulating film,
    wherein said second insulating film has a higher dielectric constant than that of said first insulating film, and
    wherein said first insulating film has a dielectric constant of about 1 to about 3.5.

2. The liquid crystal display device of claim 1, further comprising:
    an interlayer insulating film;
    a gate insulating film;
    a source electrode; and
    a drain electrode,
    wherein said interlayer insulating film is in contact with said source electrode and said drain electrode.

3. The liquid crystal display device of claim 2, wherein said interlayer insulating film is positioned between said gate insulating film and said first insulating film.

4. The liquid crystal display device of claim 1, wherein said second insulating film has a dielectric constant of about 3.5 or more.

5. The liquid crystal display device of claim 4, wherein said second insulating film has a dielectric constant of about 3.5 to about 25.

6. The liquid crystal display device of claim 1, wherein said first insulating film is made from an organic insulating material.

7. The liquid crystal display device of claim 1, wherein said second insulating film is made from an inorganic insulating material.

8. The liquid crystal display device of claim 1, wherein said storage capacitor electrode is made from an opaque metal material, and formed on said plurality of nonlinear elements.

9. The liquid crystal display device of claim 1, wherein said first insulating film is made from a polymer compound having a glass transition temperature of about 200° C. or higher.

10. The liquid crystal display device of claim 9, wherein said first insulating film is made from a polymer compound having a glass transition temperature of about 300° C. or higher.

11. The liquid crystal display device of claim 1, wherein said storage capacitor electrode is made from a different material from that of said pixel electrode.

12. The liquid crystal display device of claim 1, wherein said first insulating film has a dielectric constant of about 1 to about 3.

13. The liquid crystal device of claim 12, wherein said first insulating film comprises an organic insulating material.

14. The liquid crystal device of claim 13, wherein said first insulating film comprises a polymer compound having a glass transition temperature of about 200° C. or higher.

15. The liquid crystal device of claim 14, wherein the polymer compound has a glass transition temperature of about 300° C. or higher.

16. The liquid crystal device of claim 13, wherein said second insulating film has a dielectric constant of about 3.5 to about 25.

17. The liquid crystal device of claim 16, wherein said second insulating film has a dielectric constant of about 7 to about 25.

* * * * *